US008299861B2

(12) United States Patent
Tatoian et al.

(10) Patent No.: US 8,299,861 B2
(45) Date of Patent: Oct. 30, 2012

(54) MODULAR MICROWAVE SOURCE

(75) Inventors: James Z. Tatoian, Pasadena, CA (US); William Nunnally, Galveston, TX (US); Scott Tyo, Tucson, AZ (US)

(73) Assignee: Eureka Aerospace, Inc., Pasadena, CA (US)

( * ) Notice: Subject to any disclaimer, the term of this patent is extended or adjusted under 35 U.S.C. 154(b) by 7 days.

(21) Appl. No.: 12/909,602

(22) Filed: Oct. 21, 2010

(65) Prior Publication Data

US 2012/0098607 A1    Apr. 26, 2012

(51) Int. Cl.
*H03B 5/18* (2006.01)
*H03K 3/42* (2006.01)

(52) U.S. Cl. .................... 331/96; 307/106
(58) Field of Classification Search ............ 331/96, 331/99, 107 DP, 107 P, 127, 126, 173; 315/32, 315/33, 39, 77, 76, 209 R, 505; 307/106
See application file for complete search history.

(56) References Cited

U.S. PATENT DOCUMENTS

2007/0145916 A1* 6/2007 Caporaso et al. ............. 315/505
2007/0165839 A1* 7/2007 London .................... 379/413.04
2008/0265778 A1* 10/2008 Rhodes ........................... 315/39

OTHER PUBLICATIONS

Druce et al., "Wideband Microwave Generation with GaAs Photoconductive Switches", Pulsed Power Conference, 1991, Digest of Technical Papers, Eighth IEEE International, Jun. 16-19, 1991, pp. 114-117.*

* cited by examiner

*Primary Examiner* — Ryan Johnson
(74) *Attorney, Agent, or Firm* — The Hecker Law Group, PLC

(57) ABSTRACT

The present invention comprises a modular microwave source comprising a novel electromagnetic oscillator based on a modified Blumlein architecture with an integrated antenna. In one or more embodiments, the invention comprises a triplate Blumlein in which the plates are configured and arranged to act as a waveguide and antenna. In one or more embodiments, high-permittivity dielectric materials are disposed between the center plate and one or both of the top and bottom plates to increase the energy storage and lengthen the duration of a damped sinusoid output. In one or more embodiments, photo-conductive semiconductor switches are disposed between the center plate and one or both of the top and bottom plates to act as high-speed switches. In one or more embodiments, a plurality of the modular microwave sources of the invention are arranged in an array, creating a compact, tunable, high-power microwave source suitable for mobile applications.

22 Claims, 17 Drawing Sheets

MODULAR MICROWAVE SOURCE

BACKGROUND OF THE INVENTION (1) Field of the Invention

The present invention relates to microwave generation and transmission systems, and more particularly to a modular microwave source comprising a novel Blumlein-like microwave oscillator and integrated antenna.

(2) Description of the Related Art

High Power Electromagnetic (HPEM) systems are being investigated for potential use for disabling motor vehicles, vessels, and aircraft for security and law enforcement purposes. It has been proposed that properly configured and directed microwave radiation can induce currents in wiring of a vehicle that can cause a malfunction of the vehicle's electronic control module ("ECM") and/or other electronic components that can cause the vehicle's engine to stop running, thereby disabling the vehicle. Being able to remotely disable a vehicle would be useful, for example, in perimeter protection of installations and facilities as well as in law enforcement activities such as car chases.

Inducing a disabling current in vehicle wiring typically requires that wiring connected to the vehicle's ECM be subjected to an electromagnetic field having a frequency, energy density, and duration sufficient to induce sufficient current to cause the ECM to malfunction. At the same time, the electromagnetic field must not be harmful to human occupants of the vehicle at which it is directed.

Prior art HPEM systems can be widely grouped into three categories based on the system bandwidth: narrowband, mesoband, and ultra-wideband. The technologies of these classes of sources are quite different. Narrowband HPEM systems use expensive and bulky pulsed power systems to deliver energy to a relativistic electron beam. This beam is made to interact with a microwave cavity where kinetic energy from the beam is converted into microwave energy. These systems have extremely high average powers, but are very costly, power hungry, and inefficient. They are viable for platforms with significant power and weight budgets, such as ships, large airplanes, military ground vehicles, etc. Ultra-wideband (UWB) systems are at the opposite end of the spectrum. These systems have peak powers comparable to narrowband systems, but generate shorter-duration waveforms, thereby having much lower average power. These systems have the advantage of coupling across decades of bandwidths, but at very low energy spectral densities.

Mesoband systems have recently emerged as an outgrowth of wideband technology. Mesoband HPEM systems typically use components and techniques that were originally designed for UWB applications and couple them with a microwave oscillator to produce a waveform that has much lower bandwidth than UWB systems. Mesoband systems produce higher average power over a narrower bandwidth than UWB systems, giving significantly higher power spectral densities than similar UWB systems. The most important parameter in both the Mesoband and UWB systems used to direct energy in a specific direction is the maximum electric field produced at the radiating aperture. Present systems are limited to values much less than the breakdown electric field of the atmosphere.

Components of an example prior art Mesoband system are shown in FIG. 1. In the example shown in FIG. 1, the components include a primary power supply 110, a power conditioner 120, a pulse generator 130, an oscillator 140, and an antenna 150. Primary power supply 110 is an available AC or DC power source. Power conditioner 120 rectifies, accumulates and/or multiplies the voltage supplied by primary power supply 110. Power conditioner 120 may, for example, comprise one or more capacitors that are charged by power supply 110 in parallel and then discharged either in parallel or in series. A Marx generator is a well known power conditioner used in HPEM systems that multiplies the voltage of a power supply by charging capacitors in parallel and then discharging them in series.

Transmission line pulse forming networks ("PFNs") may be used in Mesoband systems as pulse generators and oscillators. An example of a basic transmission line PFN is shown in FIG. 2. The transmission line PFN of FIG. 2 comprises a transmission line 220 of length L and having impedance $Z_0$. At one end, the two conductors of the line 220 are connected to an output load 230, such as, for example an antenna. Output load 230 has an impedance $Z_L$. At the other end, the two conductors are connected to a high-speed switch 240 (such as, for example, a spark gap) and a high voltage power source 210. To generate high frequency microwaves, high speed switch 240 should be able to operate at high voltages and high currents with sub-nanosecond resistive transition time and minimum inductance. Transmission line 220 is charged by power source to voltage $V_0$ (typically at 10-50 KV for HPEM system applications). When high speed switch 240 is closed, transmission line 220 discharges through output load 230. If the impedance of the output load 230 is matched to the impedance of the transmission line 220 (i.e. $Z_L=Z_0$), the transmission line operates as a pulse generator and the output is a single pulse of voltage $0.5\,V_0$ with a duration dependent on the length L of transmission line 220. If the impedances are mismatched (i.e. $Z_L \neq Z_0$), the transmission line operates as an oscillator and the output is a damped sinusoid whose frequency depends on length L.

FIG. 3 shows a variation of the transmission line PFN of FIG. 2 called a "Blumlein transmission line pulse generator" or simply a "Blumlein." A Blumlein uses two transmission lines to create an output pulse of voltage $V_0$, twice the voltage of the pulse produced by a single transmission line PFN.

The Blumlein of FIG. 3 includes transmission lines 320 and 350, having lengths L1 and L2, and impedances Z1 and Z2, respectively. The inner conductors of transmission lines 320 and 350 are connected together, while the outer conductors are connected across output load 330. In the Blumlein Pulse system of FIG. 3, a high speed switch 340 and high voltage power source 310 are connected between the inner and outer conductors of line 320. To generate a pulse using the Blumlein of FIG. 3, transmission line 320 is charged to voltage V0 by power source 310, and then discharged by closing high-speed switch 340. If the two lines 320 and 350 have equal lengths and impedances, and if the output load impedance is equal to the sum of the line impedances, then the output is a single pulse of voltage V0 with a length dependent on the lengths of lines 320 and 350. If the lengths and impedances of the two lines are equal, but the load impedance does not match the line impedances, the output is a damped sinusoid whose frequency depends on the length of the two lines. If the lengths and impedances of the two lines are not equal and the load impedance is not matched to the line impedances, the output is a combination of two damped sinusoids whose frequencies depend on the respective lengths of the two lines.

Another configuration of a prior art Blumlein, referred to as a "tri-plate Blumlein," is shown in FIG. 4. In the tri-plate Blumlein shown in FIG. 4, metal plates are used in place of the transmission lines of the Blumlein of FIG. 3. Center plate 450 takes the place of the inner conductors of lines 320 and 350 in FIG. 3. Top plate 460 takes the place of the outer conductor of line 350 of FIG. 3, and bottom plate takes the place of the outer conductor of line 320 in FIG. 3. As shown in FIG. 4, a high voltage power supply 410 charges center plate 450 with respect to bottom plate 420 A high speed switch 440 is connected between bottom plate 420 and center plate 450. In operation, high voltage power conditioner 120 is used to charge center plate 450. After the plate is charged, closing high speed switch 440 causes a high-voltage pulse to be generated in the similar manner as in the transmission line Blumlein of FIG. 3.

Antennas commonly used in HPEM systems include, for example, parallel plate waveguides and horn and helical antennas.

To be practical for mobile uses (such as being mounted on cars or small aircraft such as police helicopters), a vehicle disabling HPEM system must be small enough to be mountable to the vehicle platform (e.g. police car or helicopter), must be tunable over a wide frequency range (e.g. 200-1350 MHz), and must be able to deliver rapid and repeated bursts of directed microwave energy. Prior art HPEM systems are not able to meet this need.

BRIEF SUMMARY OF THE INVENTION

The present invention comprises a modular microwave source comprising a novel electromagnetic oscillator based on a modified Blumlein architecture that serves as an integrated antenna. In one or more embodiments, the invention comprises a triplate Blumlein in which the plates are configured and arranged to act as a waveguide and antenna. In one or more embodiments, high-permittivity dielectric materials are disposed between the center plate and one or both of the top and bottom plates to increase the energy storage and lengthen the duration of a damped sinusoid output. In one or more embodiments, photo-conductive semiconductor switches are disposed between the center plate and one or both of the top and bottom plates to act as high-speed switches. In one or more embodiments, one or more of the plates is configured as an angular metal electrode, such as, for example, an extruded aluminum channel. In one or more embodiments, the top and bottom plates are replaced by a single angular electrode. In some embodiments the top and bottom conductors are electrically shorted to change the system dynamics at the switches. In one or more embodiments, the configuration of the plates and dielectric materials results in an integrated microwave oscillator and antenna structure. In one or more embodiments, the permittivity of the dielectric materials disposed between the plates varies over the lengths of the plates allowing the generation of additional frequencies by selectively activating switches adjacent to different sections of the dielectric materials. In one or more embodiments, a plurality of the modular microwave sources of the invention are arranged in an array, creating a compact, tunable, high-power microwave source suitable for mounting on mobile platforms. In one or more embodiments a collimated laser light source is configured to deliver optical energy to a novel photoconductive semiconductor switch (PCSS) in a manner that controls the formation of conductive filaments on the semiconductor surface and prevents failure of the optical switch from repeated high current discharges. In one or more embodiments, a light source such as miniature laser is used in an integrated switch/laser configuration.

DETAILED DESCRIPTION OF THE INVENTION

The present invention comprises a modular microwave source comprising a novel electromagnetic oscillator based on a modified-Blumlein architecture with an integrated antenna, which may be at times referred to herein as an "integrated Blumlein antenna module" or "IBA module."

Figure 5:
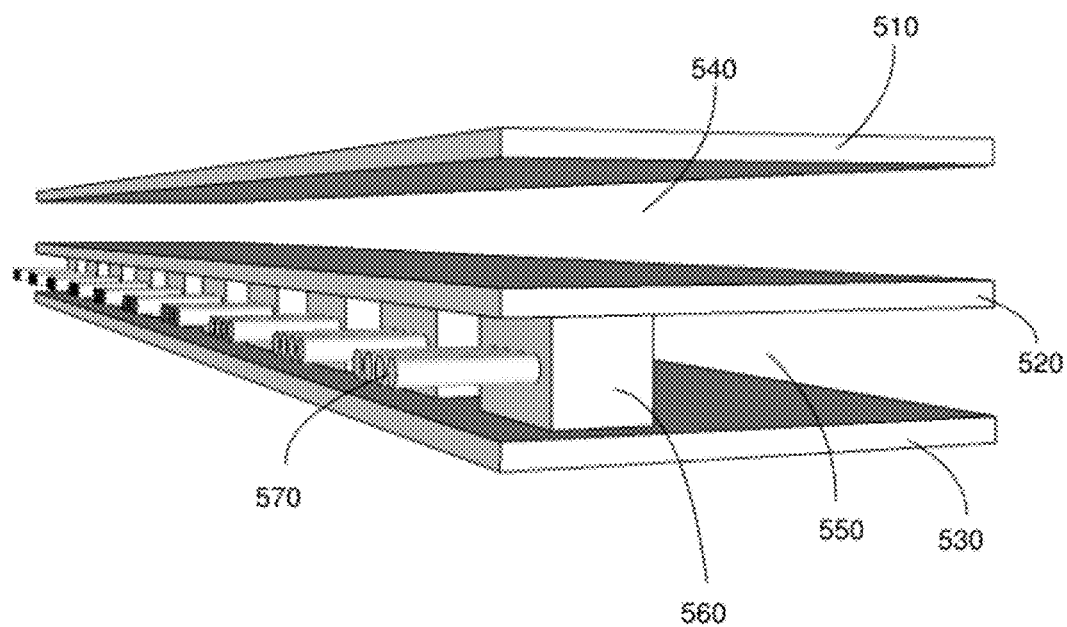
FIG. 5 is a perspective view of an embodiment of an integrated Blumlein/antenna module ("IBA module") of the invention.

FIG. 5 shows an embodiment of an IBA module of the invention. The embodiment of FIG. 5 comprises an upper plate 510, a center plate 520, and a lower plate 530. Upper plate 510, center plate 520, and lower plate 530 are disposed spaced apart yet generally parallel to each other such that there is a first space 540 between upper plate 510 and center plate 520 and a second space 550 between center plate 520 and lower plate 530. In the embodiment of FIG. 5, plates 510, 520 and 530 have high length-to-width ratios such that the width of each of the plates is less that their length. For example, in one embodiment, the width of the plates is about 2 inches, while the length is about 8 inches, resulting in a length-to-width ratio of about 4.

In the embodiment of FIG. 5, a series of high-speed switches 560 (shown in FIG. 5 in generic block form) are disposed between center plate 520 and bottom plate 530 adjacent the rear edges of plates 520 ad 530. High speed switches 560 can comprise spark gaps or any other high speed switches as known in the art.

Figure 17:
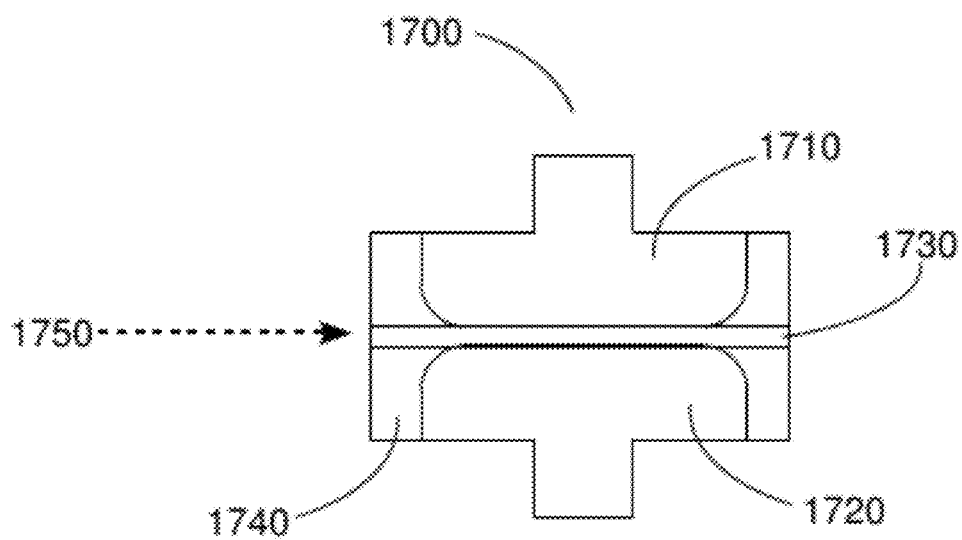
FIG. 17 is a sectional view of a PCSS of the prior art.

In one or more embodiments high speed switches 560 comprise photo-conductive semiconductor switches ("PCSS"). PCSSs are disclosed, for example, in U.S. Pat. No. 5,804,814 entitled "GAAS Photoconductive Semiconductor Switch," issued on Sep. 8, 1998, and Patent Publication No. US2007/0092812 entitled "Optically Initiated Silicon Carbide High Voltage Switch," published on Apr. 26, 2007, which are incorporated by reference herein. In a typical PCSS, two electrodes are separated by a semiconductor substrate (for example, gallium arsenide, silicon, or silicon carbide) that becomes conductive upon application of a high intensity pulse of light, typically produced by a laser. A cross-section of an example prior art PCSS is shown in FIG. 17. PCSS 1700 of FIG. 17 comprises upper and lower electrodes 1710 and 1720 in contact with a semiconductor substrate 1730 (for example SiC) partially encapsulated by a high permittivity encapsulant 1740. A light source 1750 (for example a YAG laser) directed at semiconductor substrate 1730 causes substrate 1730 to become conductive, thereby closing the switch and allowing current to flow between upper and lower conductors 1710 and 1720.

In the embodiment of FIG. 5, fiber optic ribbon cables 570 are used to direct laser light onto the photo sensitive semiconductor substrates of optical switches 560, which may, for example, comprise PCSS's such as PCSS 1700 of FIG. 17. In one or more embodiments, beam splitters and other optical elements are used to convey light along fiber optic ribbon cables 570 such that light generated by a laser (not shown) simultaneously reaches each of switches 560, such that the switches can be triggered simultaneously by the laser.

Figure 6:
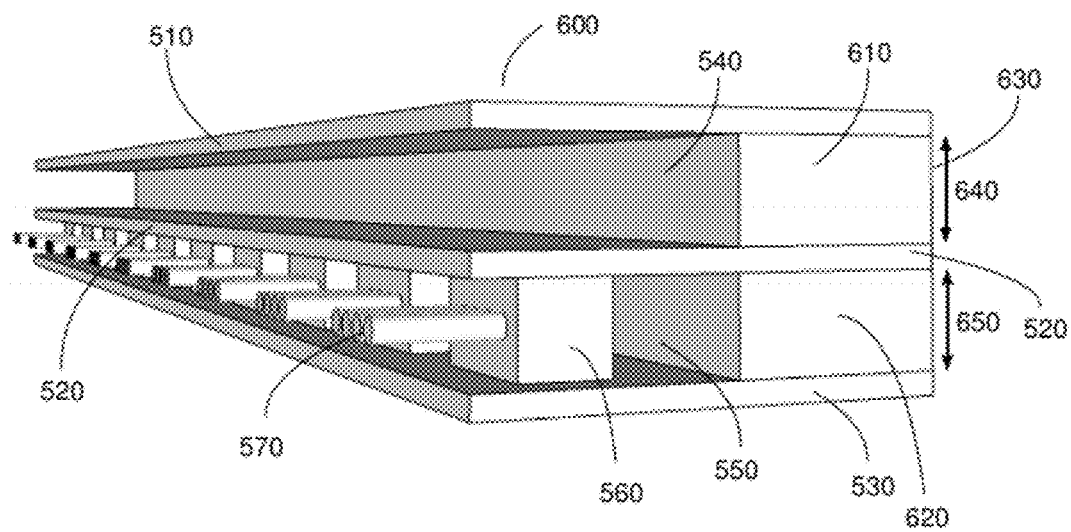
FIG. 6 is a perspective view of an embodiment of an IBA module of the invention.

FIG. 6 shows an embodiment of an IBA module 600 in which dielectric materials 610 and 620 have been disposed within a portion of the spaces 540 and 550 between plates 510, 520 and 530. High capacitance dielectric materials decrease the impedance between center plate 520 and upper and lower plates 510 and 530, respectively. In essence they act as capacitors that store electromagnetic energy.

Figure 1:
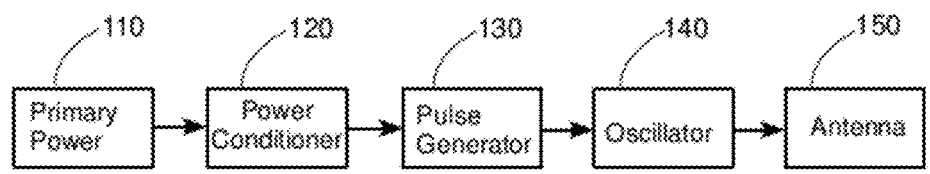
FIG. 1 is a block diagram of a Mesoband HPEM system of the prior art.
Figure 2:
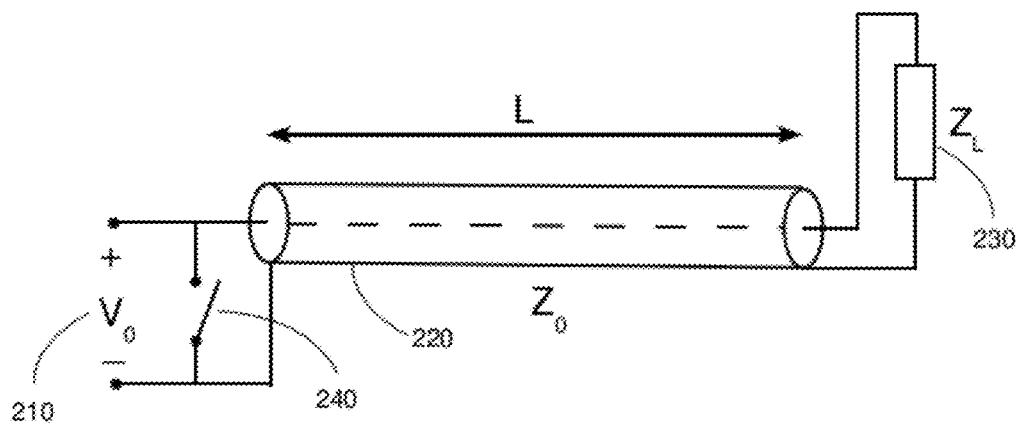
FIG. 2 is a schematic block diagram of a transmission line PFN of the prior art.
Figure 3:
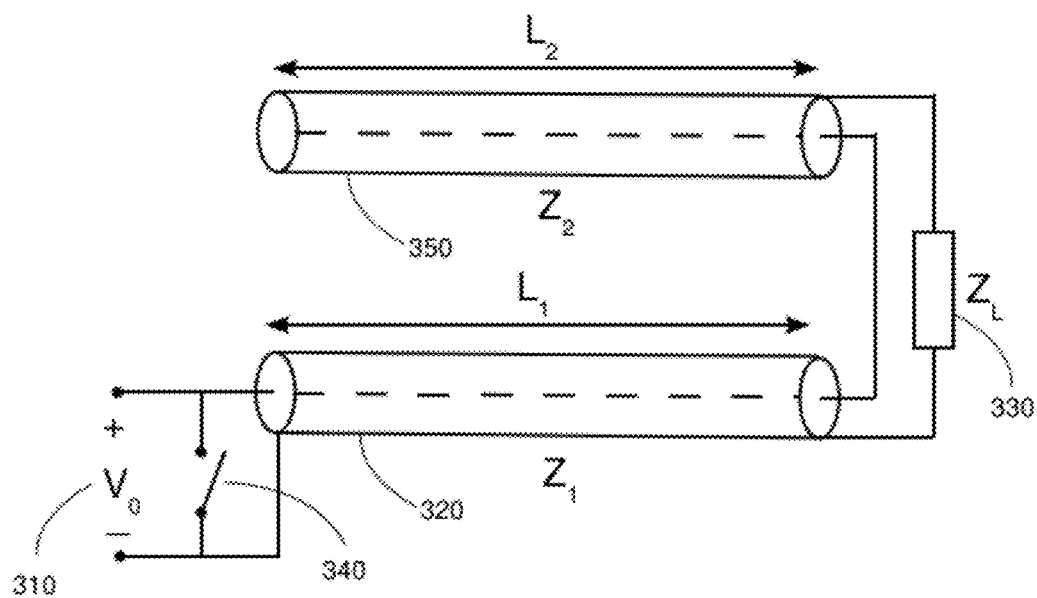
FIG. 3 is a schematic block diagram of a Blumlein PFN of the prior art.
Figure 4:
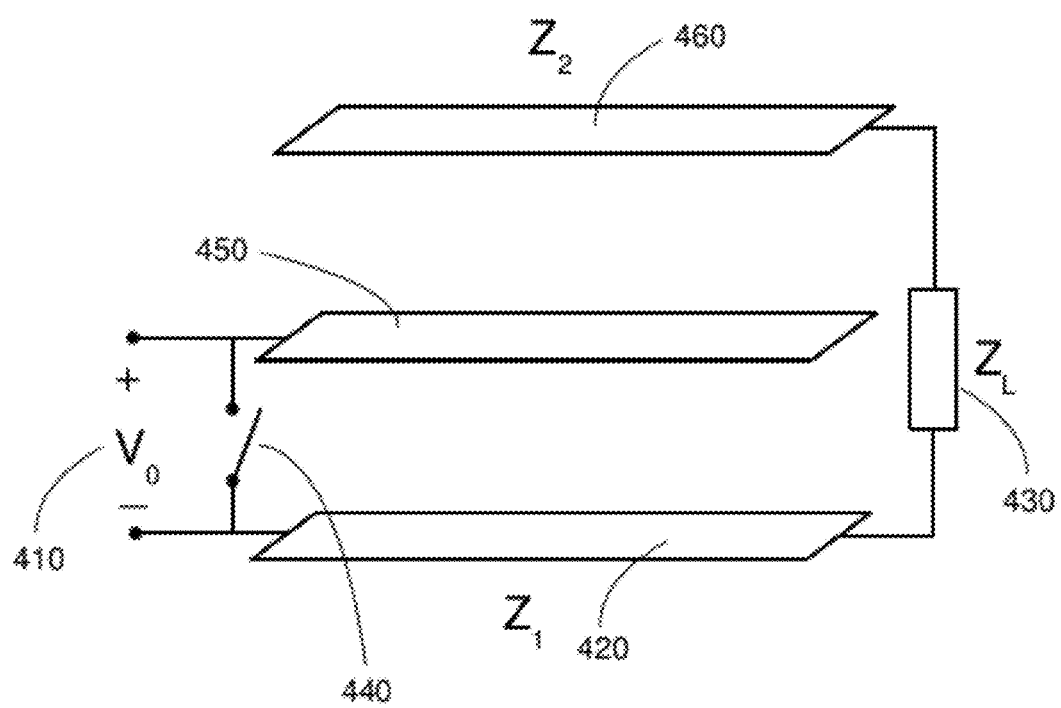
FIG. 4 is a schematic block diagram of a tri-plate Blumlein PFN of the prior art.

In one mode of operation, a high voltage power source is used to charge center plate 520 with respect to upper and lower plates 510 and 530, respectively. Optical switches 560 are then triggered simultaneously by a pulse of laser light delivered along fiber optic ribbon cables 570, thereby causing upper and lower plates 520 to discharge, generating a high-voltage pulse in a similar manner to the tri-plate Blumlein of FIG. 4. Because of the aspect ratio of the plates and the positioning of the dielectric materials of IBA module 600, however, no separate antenna is required to generate a directed radiation of microwaves. Instead, the configuration of the plates and dielectric in the IBA module 600 causes the plates to effectively act as an aperture that causes microwaves to be radiated in a transverse direction to the long dimension (i.e. the z-dimension perpendicular into to the plane of FIG. 6) of the plates such that the front face 630 of IBA module 600 (i.e. the face opposite the optic fiber ribbon cables 570 in FIG. 6) effectively acts as a microwave antenna with a first aperture 640 bounded by upper plate 510 and center plate 520 and a second aperture 650 bounded by center plate 520 and lower plate 530. The resonant properties of IBA module allow it to radiate efficiently from the open end, at one or more resonant frequencies, integrating the antenna into the oscillator. As compared to the prior art tri-plate Blumlein of FIG. 4, the load 430 of FIG. 4 has been replaced by a radiating aperture composed of first and second apertures 640 and 650 in IBA module 600 of FIG. 6. Compared to prior art high power microwave sources, in one or more embodiments, the fields in the aperture of the antenna are uniformly close to the breakdown strength of air.

Figure 7:
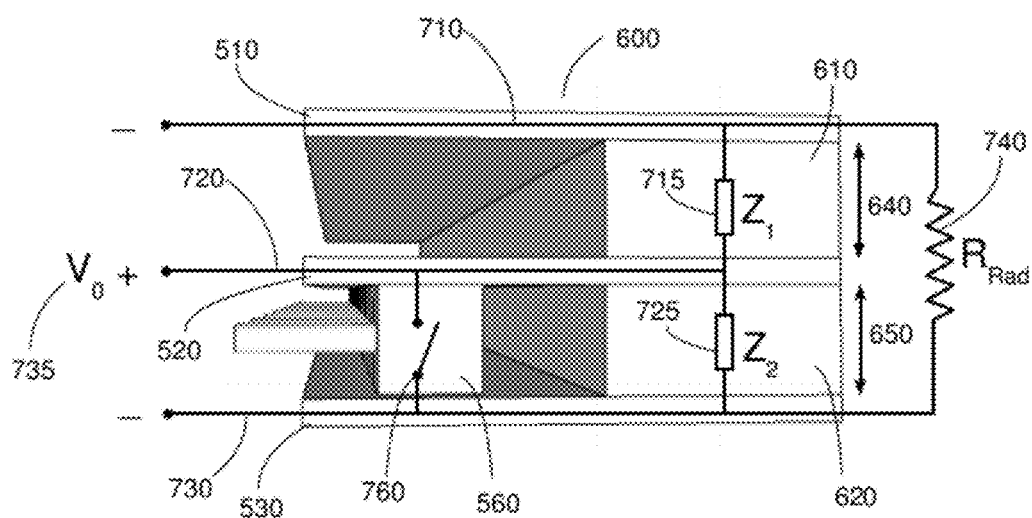
FIG. 7 is a schematic perspective view of an embodiment of an IBA module of the invention.

The operation of the IBA module 600 can further be understood by reference to FIG. 7. FIG. 7 shows a schematic circuit representation of IBA module 600 superimposed on a perspective side view of IBA module 600. In the schematic representation of FIG. 7, upper, center, and lower plates 510, 520 and 530 are represented by upper, center, and lower transmission lines 710, 720 and 730, respectively. Dielectric material 610 is represented by load 715 having capacitance $Z_1$ and dielectric material 620 is represented by load 725 having an impedance $Z_2$. Radiating apertures 640 and 650 are represented by radiating load 740. Optical switches 560 are represented by high speed switch 760. A high voltage power source 735 has its positive terminal connected to center transmission line 720, while its negative terminal is connected to upper and lower transmission lines 710 and 730, respectively.

In one mode of operation, high voltage power source 735 charges upper and lower transmission lines 710 and 730 with respect to center transmission line 720 (for example, to a potential difference of 30 KV or more). High speed switch 760 is then closed, causing top and bottom transmission lines to discharge through radiating load 740, generating a high voltage pulse. Depending on the permittivity of dielectric materials and the configuration and properties of the transmission lines (i.e. plates 510, 520 and 530), the pulse may take the form of a single step pulse or a damped sinusoid with one or more frequencies determined by the resonant frequency or frequencies of the IBA module structure.

FIGS. 8 to 13 show a second embodiment of the IBA module of the invention. Instead of using flat plates as in IBA module 600 of FIG. 6, IBA module 1200 of FIGS. 8 to 13 uses plates that have been formed into more complex shapes that aid in the generation and directed emission of microwave pulses. In the embodiment of FIGS. 8 to 13, upper and lower metal plates 510 and 530 of IBA module 600 of FIG. 6 are replaced with a modified U-shaped metal outer electrode 810 that includes a top plate portion 805, a back plate portion 815, a lower plate portion 825, and fin portion 830. Center plate 520 of IBA module 600 is replaced with L-shaped metal inner electrode 820 that includes a top plate portion 822 and a back plate portion 824. Inner and outer electrodes 810 and 820 may, for example, comprise extruded metal channels, such as, for example, extruded aluminum channels. In one or more embodiments, electrodes 810 and 820 may be formed from non-metallic conductive material.

Figure 8:
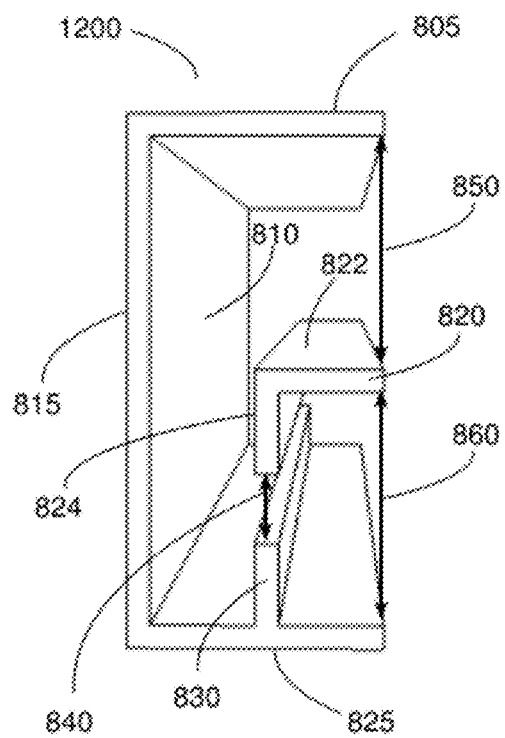
FIG. 8 is a perspective view of an embodiment of an IBA module of the invention.

In the embodiment of FIG. 8, inner and outer electrodes 810 and 820 are disposed such that back plate portion 824 of inner electrode 820 is generally disposed above fin portion 830 of outer electrode 810 such that a gap 840 is formed between back plate portion 824 and fin 830. Top portion 822 of inner electrode 820 is generally parallel to top plate portion 805 of outer electrode 810 and back portion 824 of inner electrode 820 is generally parallel to back portion 815 of outer electrode 810.

The arrangement of outer electrode 810 and inner electrode 820 in the embodiment of FIG. 8 forms two longitudinal apertures in the front face of IBA electrode 1200. A top aperture 850 is formed between top plate portion 805 of outer electrode 810 and top plate portion 822 of inner electrode 820. A bottom aperture 860 is formed between top plate portion 822 of inner electrode 820 and bottom plate portion 825 of outer electrode 810.

In one or more embodiments, the thickness of each of electrodes 810 and 820 is approximately 1 mm, each of apertures 850 and 860 is approximately 10 mm high, gap 840 is approximately 3 mm high, outer electrode 810 is approximately 11 mm wide and 23 mm high, inner electrode 820 is approximately 5.5 mm wide and 4.5 mm high, and each of inner and outer electrodes 820 and 810 is about 100 mm long.

Figure 9:
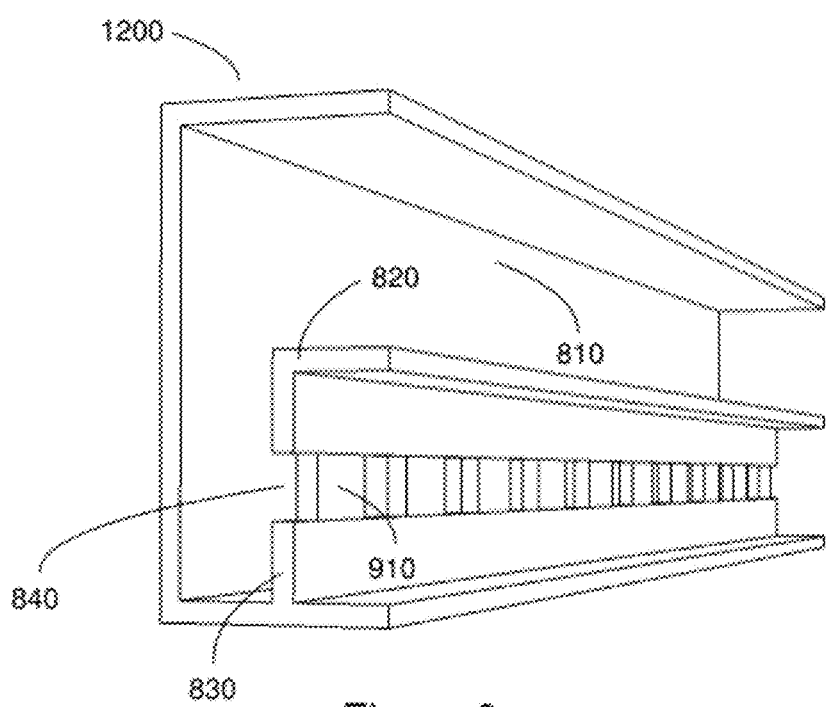
FIG. 9 is a perspective view of an embodiment of an IBA module of the invention.

As shown in FIG. 9, in one or more embodiments, one or more high speed switches 910 (shown in FIG. 9 in generic block form) are disposed in gap 840 between inner electrode 820 and fin 830 of outer electrode 810 of IBA module 1200. Multiple switches are employed and closed simultaneously to insure that the inherent inductance of the structure will respond over a desired bandwidth. In one or more embodiments, high speed switches 910 comprise optical switches, for example PCSSs. In one or more embodiments, ten switches 910 are disposed along the length of gap 840.

Figure 10:
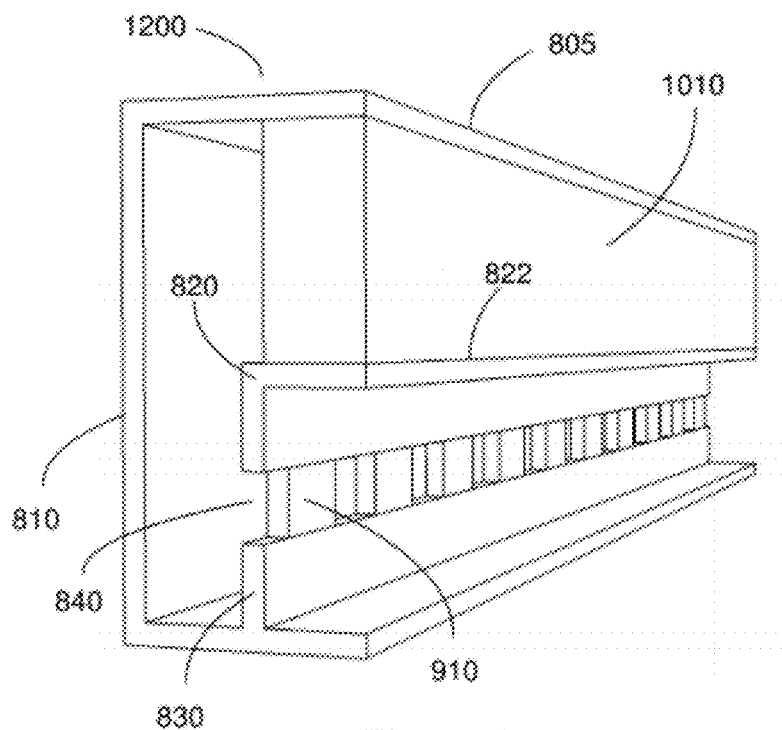
FIG. 10 is a perspective view of an embodiment of an IBA module of the invention.

As shown in FIG. 10, in one or more embodiments, a dielectric material 1010 is disposed in a portion of the space between upper plate portion 822 of inner electrode 820 and top plate portion 805 of outer electrode 810. In one or more embodiments, the cross-section of dielectric material 1010 is approximately 4.5 mm wide and 10 mm high, and its length is approximately the same as that of outer and inner electrodes 810 and 820, respectively. In one or more embodiments, dielectric material 1010 has a permittivity ($\in_1$) approximately 100 times that of free space ($\in_4$).

Figure 11:
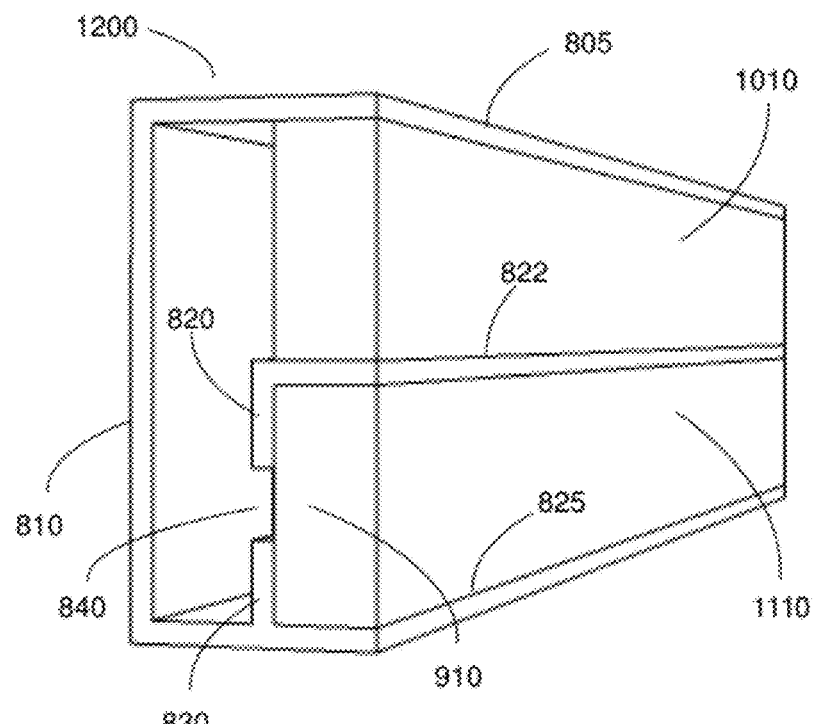
FIG. 11 is a perspective view of an embodiment of an IBA module of the invention.

As shown in FIG. 11, in one or more embodiments, a second dielectric material 1110 is disposed in a portion of the space between upper plate portion 822 of inner electrode 820 and bottom plate portion 825 of outer electrode 810 of IBA module 1200. In one or more embodiments, the cross-section of dielectric material 1110 is approximately 4.5 mm wide and 10 mm high, and its length is approximately the same as that of outer and inner electrodes 810 and 820, respectively. In one or more embodiments, dielectric material 1110 has a permittivity ($\in_2$) approximately 100 times that of free space ($\in_0$).

Figure 12:
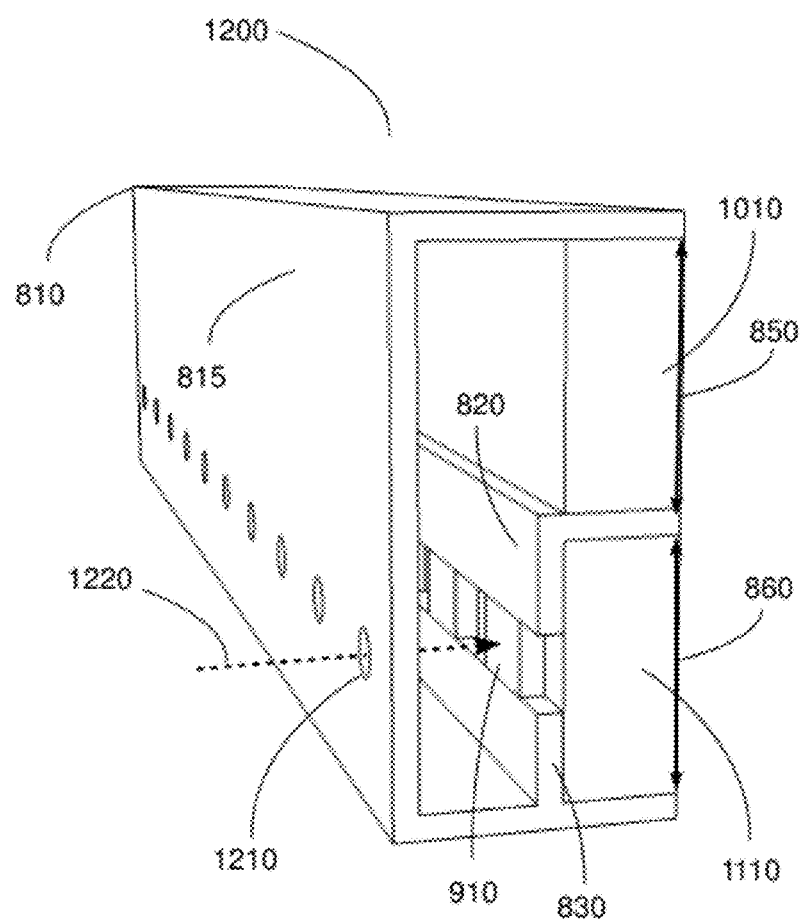
FIG. 12 is a perspective view of an embodiment of an IBA module of the invention.

As shown in FIG. 12, in one or more embodiments of IBA module 1200 in which high-speed switches 910 comprise optical switches, a series of openings 1210 are formed through back plate portion 815 of outer electrode 810 to allow light beams from an external source (not shown) to impinge upon optical switches 910. In one or more embodiments, optical fibers may be used to convey light from the external source though openings 1210 to high speed switches 910.

In one mode of operation, a high voltage power source is used to charge inner electrode 820 with respect to outer electrode 810. Optical switches 910 are then triggered simultaneously by a pulses of laser light directed at optical switches 910 trough openings 1210, thereby causing inner electrode 820 to discharge, generating a high voltage pulse that resonates through outer and inner electrodes 810 and 820 and causes the emission of microwaves through apertures 850 and 860. The configuration of outer and inner electrodes 810 and 820 and dielectric materials 1010 and 1110 in IBA module 1200 of FIG. 12 directs a greater proportion of the generated microwaves through front apertures 850 and 860 than IBA module 600 of FIG. 6.

Figure 13:
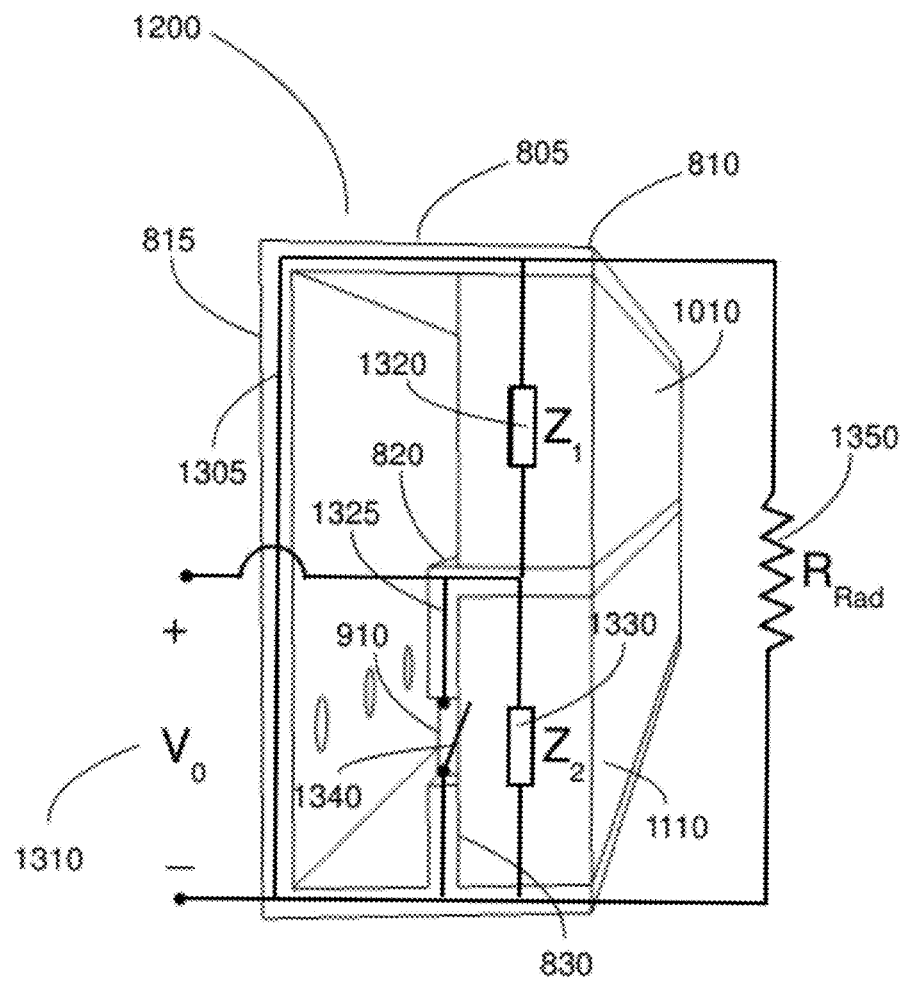
FIG. 13 is a schematic perspective view of an embodiment of an IBA module of the invention.

The operation of the IBA module 1200 can further be understood by reference to FIG. 13. FIG. 13 shows a schematic circuit representation of IBA module 1200 superimposed on a perspective side view of IBA module 1200. In the schematic representation of FIG. 13, outer electrode 810 is represented by an outer transmission line 1305, while inner electrode 820 is represented by an inner transmission line 1325. Dielectric material 1010 is represented by capacitor 1320 having impedance $Z_1$. Dielectric material 1110 is represented by capacitor 1330 having impedance $Z_2$. The radiating load presented by apertures 1010 and 1110 is represented by radiating load 1350. Optical switches 910 are represented by high speed switch 1340. A high voltage power source 1310 has its positive terminal connected to inner transmission line 1325, while its negative terminal is connected to outer transmission line 1305.

In one mode of operation, high voltage power source 1310 charges inner transmission line 1325 with respect to outer transmission line 1305 (for example, to a potential difference of 10-50 KV or more). High speed switch 1340 is then closed, causing inner transmission line 1325 to discharge through radiating load 1350, generating a high voltage pulse. Depending on the permittivity of dielectric materials and the configuration and properties of the transmission lines (i.e. outer and inner electrodes 810 and 820), the pulse may take the form of a single step pulse or a damped sinusoid with one or more frequencies determined by the resonant frequency or frequencies of the IBA module structure.

In one or more embodiments of IBA module 1200, the configuration of outer and inner electrodes 810 and 820, dielectric materials 1010 and 1110, and switches 910, IBA module 1200 exhibits two distinct resonant frequencies. In one or more embodiments, the resonant frequencies are approximately 650 MHz and 1.35 GHz. In one or more embodiments, the geometry of IBA module 1200 can be tailored to generate frequencies between approximately 100 MHz to about 15 GHz.

Figure 14:
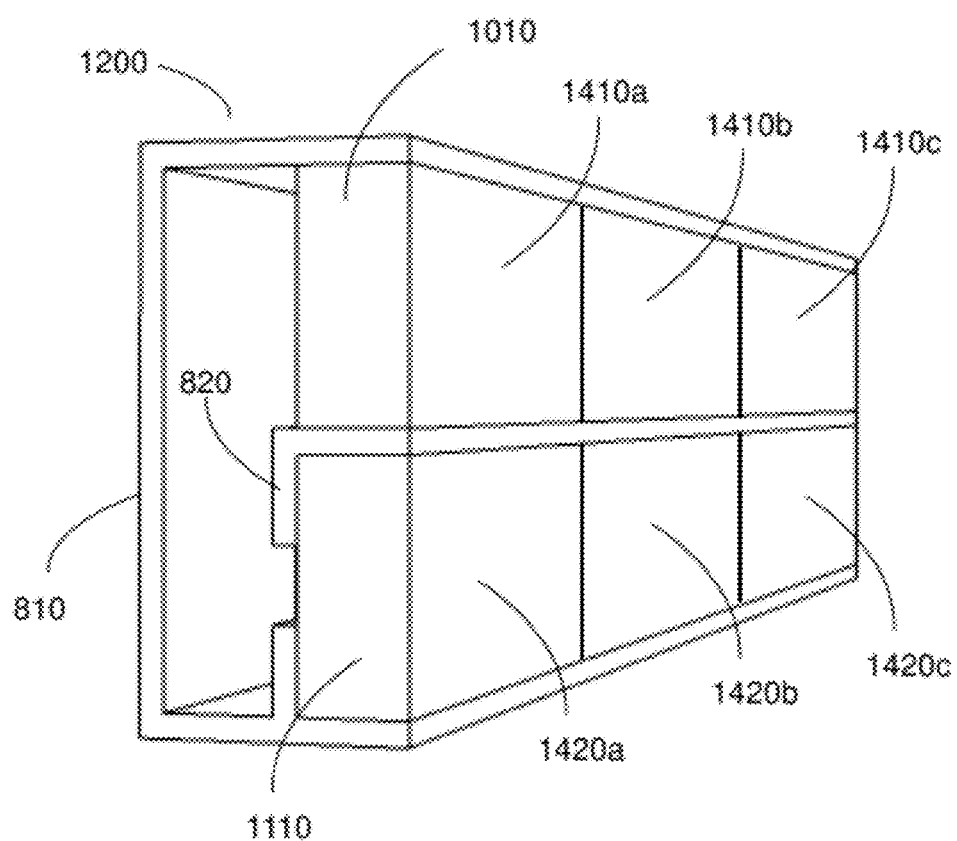
FIG. 14 is a perspective view of an embodiment of an IBA module of the invention.

The resonant frequencies of IBA module 1200 are dependent upon the dimensions of outer and inner electrodes 810 and 820 and the permittivity of dielectric materials 1010 and 1110. FIG. 14 shows an embodiment of IBA module 1200 that can selectively generate multiple pairs of frequencies. As shown in FIG. 14, each of dielectric materials 1010 and 1110 are divided along their lengths into multiple sections 1410 and 1420, respectively, each of which may have a different permittivity. By selectively triggering the high speed switches adjacent to a particular section, a pulse will be generated that has frequencies dependent on the resonant frequencies of that particular section. Alternatively, pulses having multiple peak frequencies can be generated by triggering two or more sections simultaneously. As compared to prior art high power electromagnetic sources, the invention achieves the fields across substantially the entire aperture to be uniformly close to the dielectric breakdown of air.

Figure 15:
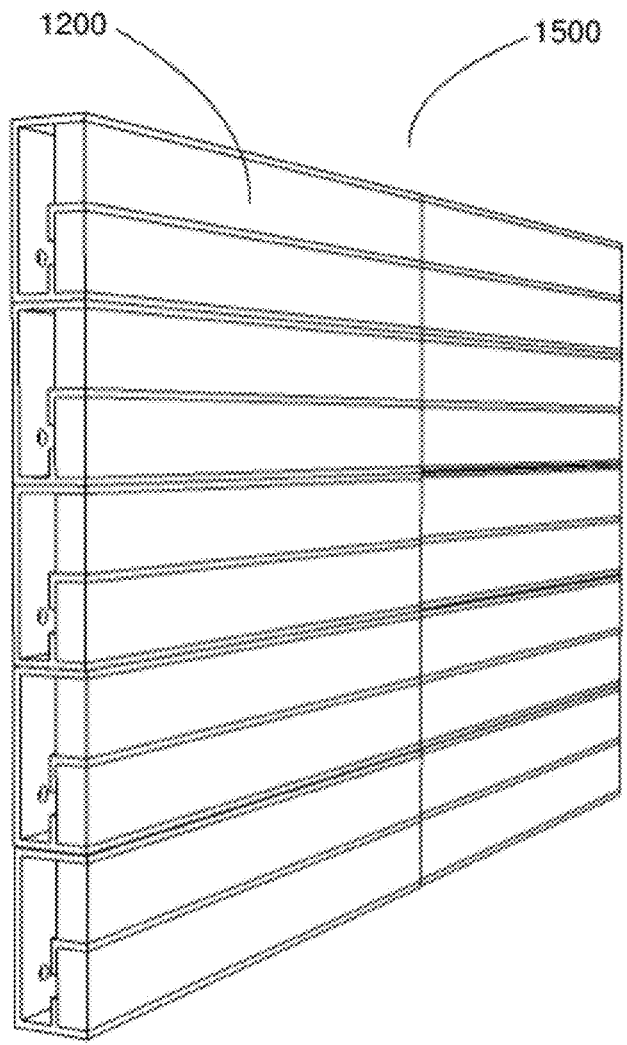
FIG. 15 is a perspective view of an embodiment of an array of IBA modules of the invention.

The IBA modules of the invention can be combined in multiple module combinations to increase the power of the microwaves generated. FIG. 15 shows an embodiment of an array 1500 comprising 10 IBA modules 1200 arranged in a two column by five row array. In such an array, outer electrodes 810 of adjacent IBA modules 1200 may be electrically coupled together. Inner electrodes 820 of adjacent IBA modules 1200 may or may not be electrically coupled together.

Multiple IBA modules can be configured in various geometries to combine the radiative emissions of the multiple IBA modules. For example, IBA modules can be arranged in rectangular arrays having M IBA modules (or "elements") in rows and N modules in columns, such as array 1500 of FIG. 15. Different numbers and/or sizes of IBA modules can be arranged in various configurations and orientations, as appropriate for the platform to which the IBA modules are mounted. For example, in a law enforcement vehicle context, a first array of IBA modules may be mounted on or adjacent to the front grille of the vehicle, which a second array of IBA modules may be mounted on the roof. Such installations of multiple IBA modules of the invention form a compact microwave source that is suitable for mounting on motor vehicles, aerial vehicles or used in stationary configurations.

Figure 16:
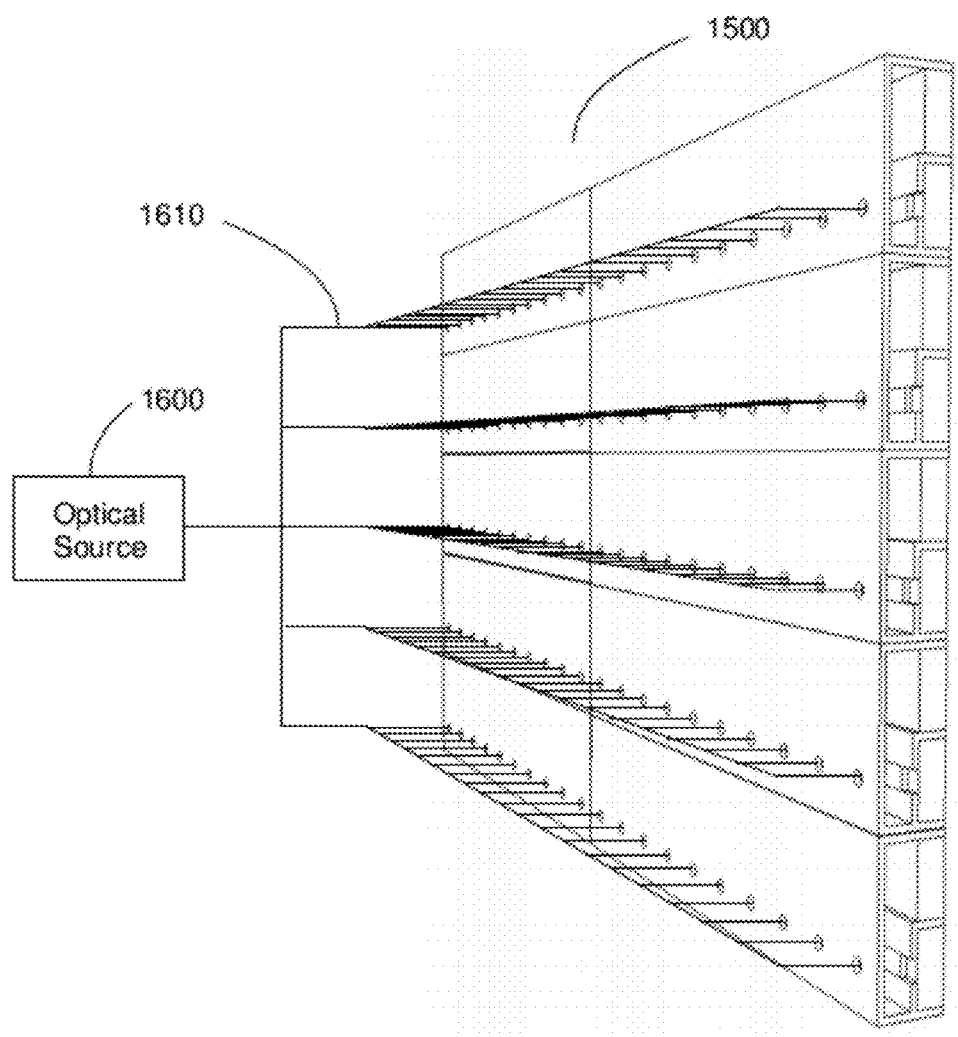
FIG. 16 is a perspective view of an embodiment of an array of IBA modules of the invention.

In one or more embodiments, a network of optical fibers conveys optical pulses produced by an optical source (a YAG laser, for example) approximately simultaneously to the optical switches of the IBA modules of a multi-IBA module installation so that the IBA modules are triggered approximately simultaneously. FIG. 16 show a schematic representation of an embodiment of a network 1610 of optical fibers that may be used to direct light pulses generated by an optical source 1600 (for example a YAG laser) to each of the optical switches in multi-IBA module installation/array 1500. Optical network 1610 may, for example, comprise beam splitters and other optical elements as known to those of skill in the art.

Figure 18:
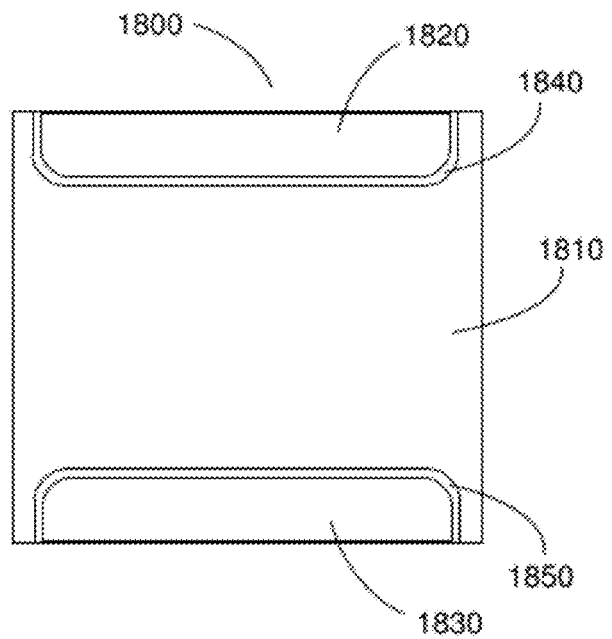
FIG. 18 is a front view of an embodiment of a PCSS of the invention.
Figure 19:
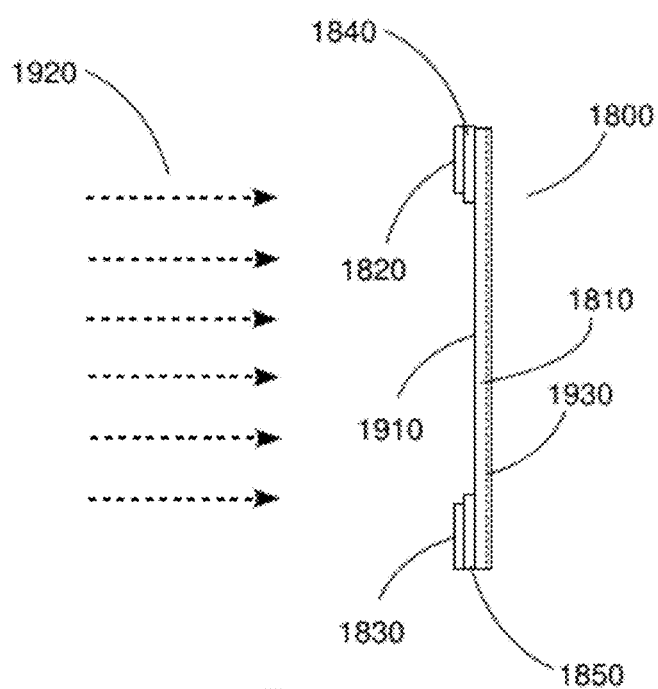
FIG. 19 is a side view of an embodiment of a PCSS of the invention.

FIGS. 18 and 19 show an embodiment of an optical switch that may be used with an IBA module of the invention. The optical switch 1800 of FIGS. 18 and 19 comprises a semiconductor substrate (e.g. GaAs or SiC) 1810 with contacts 1820 and 1830 formed along opposite edges of semiconductor substrate 1810. In the embodiment of FIGS. 18 and 19, contacts 1820 and 1830 comprise metal layers disposed over intermediate layers 1840 and 1850, respectively. Intermediate layers 1840 and 1850 may comprise a metal, semiconductor, of a combination thereof, and may themselves comprise multiple layers.

In one embodiment, semiconductor substrate 1810 comprises a rectangular sheet of GaAs approximately 1 cm square and 350 µm thick. Intermediate layers 1840 and 1850 comprise conducting epitaxial layers of doped GaAs approximately 9 mm long, 1.525 mm wide, and several µm thick, with rounded corners having a radius of curvature of approximately 1.025 mm Contacts 1820 and 1830 comprise layer of conductive material approximately 8.95 mm long, 1.5 mm wide, and several µm thick, with rounded corners having a radius of curvature of approximately 1 mm are deposited on top of the epitaxial matching layer.

As shown in FIG. 19, in one or more embodiments, a portion of semiconductor substrate 1810 becomes conductive up to a depth 1930 when the front surface 1910 of semiconductor substrate 1810 is exposed to photons from a light source 1920 (such as, for example, a YAG laser), thereby allowing current to flow between contacts 1820 and 1830. In one or more embodiments, optical switch 1800 can hold off approximately 30 kV between contacts 1820 and 2830. In one or more embodiments, optical switch 1800 exhibits an effective closure time of less than 400 ps, with low jitter.

One problem with optical switches of the prior art is that current flow through the semiconductor substrate is not uniform, especially in high voltage applications. Instead, current is concentrated in paths of least resistance, sometimes referred to as conductive filaments, that are randomly formed by photons from the light source interacting with the semiconductor substrate. As a result, instead of being spread out evenly throughout the semiconductor substrate, current is concentrated in these conductive filaments, which leads to vaporization of contacts and destruction of the semiconductor material adjacent to the filament.

In one or more embodiments of the invention, a novel optical illumination system is used to produce multiple parallel conductive filaments that share the current, thereby preventing the concentration of current in the generally smaller number of conductive filaments that are randomly formed when using prior art illumination methods. Instead of directing a light source generally uniformly across the surface of the semiconductor substrate of a PCSS, the optical illumination system of the present invention concentrates the light into thin, parallel bands of light that illuminate corresponding parallel strips of the semiconductor substrate. Multiple, parallel current filaments are formed in these parallel strips which share the current, thereby reducing the maximum current flowing through any one filament and preventing the resulting damage to the switch materials.

Figure 20:
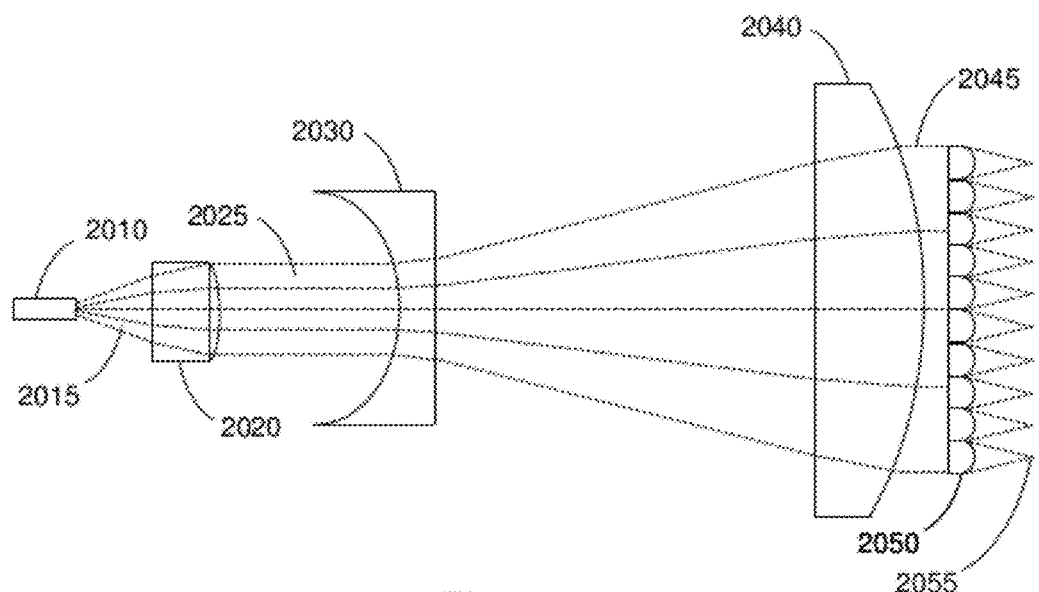
FIG. 20 is a schematic top view of an embodiment of an optical system of the invention.
Figure 21:
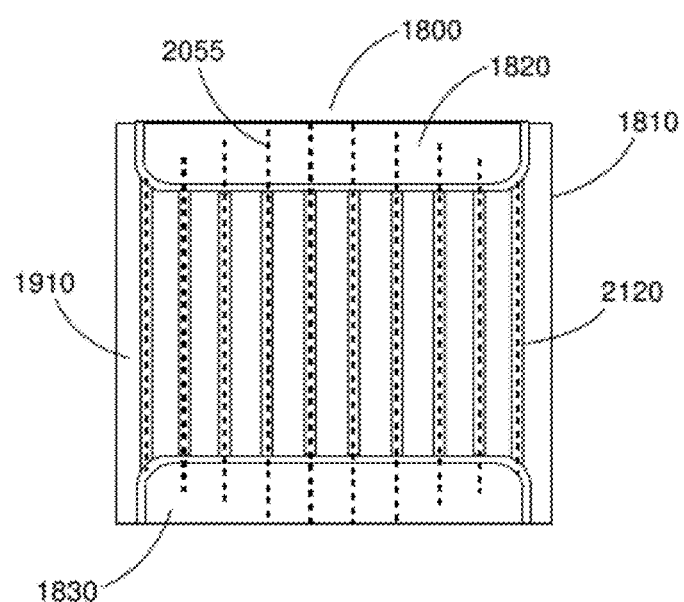
FIG. 21 is a schematic representation showing the formation of parallel conductive filaments using the optical system of FIG. 20 with the PCSS of FIGS. 18 and 19.

FIG. 20 is a schematic showing a top view of an embodiment of an optical system of the present invention. In one or more embodiments, the optical system is disposed between an optical fiber delivering pulsed light from a laser light source to an optical switch and the switch itself. In the embodiment of FIG. 20, the optical system comprises an optical fiber 2010 delivering light from an optical source, such as a laser, a collimating lens 2020, a beam expander comprising a diverging lens 2030 and a converging lens 2040, and a series of concentrating lenses 2050. In the embodiment of FIG. 20, light emerges from optical fiber 2010 in an expanding cone 2015. Collimating lens 2020 collimates the expanding cone of light from optical fiber 2010 into a generally parallel beam 2025 having a generally circular cross section. Lenses 2030 and 2040 expand beam 2025 into expanded beam 2045. In one or more embodiments, Lenses 2030 and 2040 expand beam 2025 by different amounts along each axis, resulting in an expanded beam 2045 with an elliptical cross-section. Each concentrating lens 2050 focuses a portion of expanded beam 2045 into a concentrated beam 2055. In one or more embodiments, concentrating lens 2050 is a cylindrical lens and that produces a concentrated beam 2055 that comprises a thin, vertical line of light, as shown in FIG. 21, that impinges front surface 1910 of semiconductor substrate 1810 of PCSS 1800. Each concentrated beam 2055 creates a thin, parallel conductive strip 2120 within semiconductor substrate 1810. A plurality of parallel, conductive filaments are formed in parallel conductive strips 2120. Current flowing between contacts 1820 and 1830 is shared by the plurality of conductive filaments, thereby limiting the amount of current flowing through each filament.

In one or more embodiments, optical fiber 2010 is a 100 µm core multimode fiber, and the light emitted has an approximately 532 nm wavelength. Collimating lens 2020 is a planoconvex, aspherical collimator of a type used in telecommunications. Diverging lens and converging lens 2040 are each aspherical elliptic cylinder lenses. Concentrating lenses 2050 are cylindrical microlenses each approximately 0.5 mm wide with an NA of approximately 0.25. In one or more embodiments, twenty (20) lenses 2050 are arranged side by side over a distance of approximately 1 cm, creating parallel lines (or channels) of light each approximately 18 microns wide.

Figure 22:
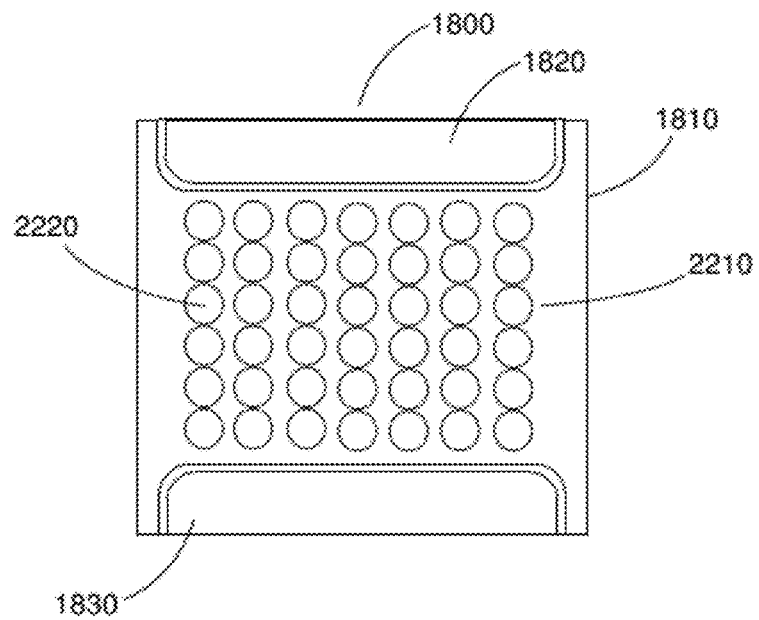
FIG. 22 shows an embodiment of a PCSS comprising an integrated light source.
Figure 23:
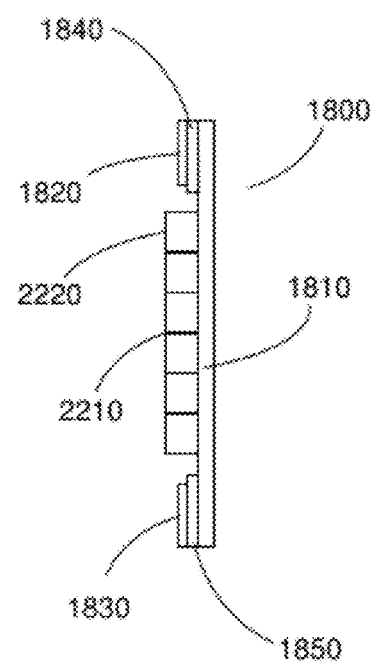
FIG. 23 is a side view of an embodiment of a PCSS comprising an integrated light source.
Figure 24:
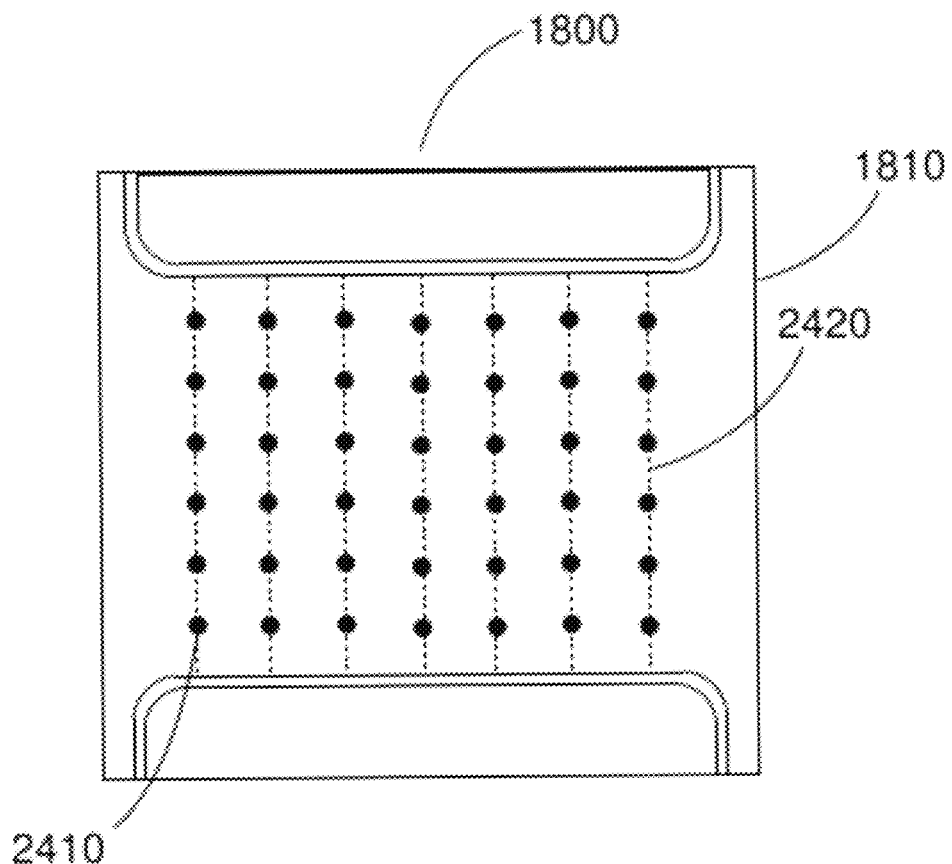
FIG. 24 is a schematic representation showing the formation of parallel conductive filaments using integrated light source of the PCSS of FIGS. 22 and 23.

FIGS. 22 and 23 show an embodiment of a PCSS of the invention in which laser diode light sources are integrated with the PCSS such that no external triggering light source is required. In the embodiments of FIGS. 22 and 23, an array 2210 of vertical cavity surface emitting laser ("VCSEL") elements 2220 (shown in simplified block form) are formed such that the laser light produced is emitted from the bottom surface, such that the emitted photons are directed at semiconductor substrate 1810 of PCSS 1800 forming dotted lines of light 2410 across the surface 1810 of PCSS 1800, as shown in FIG. 24. The multiple dotted lines of light 2410 provide sufficient intensity to initiate multiple parallel conductive filaments 2420 with uniform current sharing in semiconductor substrate 1810. Methods of forming arrays of VCSEL's are disclosed, for example, in Patent Publication No. US2010/0195689 published Aug. 5, 2010 entitled "Surface Emitting Laser Element Array," which is incorporated by reference in its entirety herein. In one or more embodiments, VCSEL's may use a structure such as that shown in FIG. 8 of Patent Publication No. US2010/0195689, or as shown in FIG. 6 of Patent Publication No. US2008/0254566 published Oct. 16, 2008 entitled "Surface-Emission Semiconductor Laser Device," which is incorporated by reference in its entirety herein. Other structures as known in the art may also be used, configured such that the light produced is imaged or guided onto semiconductor substrate 1810, as described above, and such that the high voltage across the PCSS is isolated (by physical separation, encapsulation, or otherwise) from the low voltage VCSELs. Other types of semiconductor lasers may be integrated with the PCSS of the invention, including, for example, edge emitting laser diodes and transverse junction stripe (TJS) lasers.

Thus, a novel modular microwave source has been described. Although the present invention has been described with respect to certain specific embodiments, it will be apparent to those skilled in the art that the inventive features of the present invention are applicable to other embodiments as well, all of which are intended to fall within the scope of the present invention as set forth in the claims.

What is claimed is:

1. An apparatus for radiating electromagnetic energy comprising at least one integrated antenna electromagnetic energy radiating module, said integrated antenna electromagnetic energy radiating module comprising:
   an outer electrode comprising a first cross section, said first cross section comprising an open side, first and second generally parallel sides each comprising first ends at said open side and second ends extending away from said open side, and a third side comprising first and second ends, said third side disposed generally opposite said open side between said second ends of said first and second sides, said first end of said third side being joined to said second end of said first side and said second end of said third side being joined to said second end of said second side, said open side, said first side, said second side and said third side defining an interior of said outer electrode;
   an inner electrode comprising a second cross section, said second cross section comprising a fourth side and a fifth side, said fourth and fifth sides each comprising an inner end and a outer end, said fourth and fifth sides joined along their respective inner ends such that said fourth side is disposed at an angle to said fifth side, said inner electrode being disposed within said interior of said outer electrode such that said fourth side of said inner electrode is generally between and parallel to said first and second sides of said outer electrode and said fifth side of said inner electrode is generally parallel to said third side of said outer electrode, said outer end of said fourth side of said inner electrode being disposed adjacent to said open side of said outer electrode so as to divide said open side of said outer electrode into first and second apertures, said first aperture extending from said first end of said first side of said outer electrode to said outer end of said fourth side of said inner electrode and said second aperture extending from said outer end of said fourth side of said inner electrode to said first end of said second side of said outer electrode;
   at least one switch having a first terminal electrically connected to said outer electrode and a second terminal electrically connected to said inner electrode;
   wherein said inner and outer electrodes, said first and second apertures, and said at least one switch are configured such that electromagnetic energy in the form of microwaves is emitted from said first and second apertures upon closure of said at least one switch after a voltage difference is established between said inner and outer electrodes.

2. The apparatus of claim 1 further comprising:
   a first dielectric comprising a first permittivity disposed adjacent said first aperture between said first side of said outer electrode and said fourth side of said inner electrode.

3. The apparatus of claim 1 further comprising:
   a second dielectric comprising a second permittivity disposed adjacent said second aperture between said fourth side of said inner electrode and said second side of said outer electrode.

4. The apparatus of claim 2 further comprising:
   a second dielectric comprising a second permittivity disposed adjacent said second aperture between said fourth side of said inner electrode and said second side of said outer electrode.

5. The apparatus of claim 4 wherein said first permittivity is approximately 100 times that of free space.

6. The apparatus of claim 5 wherein said second permittivity is approximately 100 times that of free space.

7. The apparatus of claim 1 wherein:
   said outer electrode has a first width measured from said first end of said first side of said outer electrode to said second end of first side of said outer electrode;
   said outer electrode has a first height measured from said first end of said third side of said outer electrode to said second end of third side of said outer electrode;
   said first height being greater than said first width.

8. The apparatus of claim 7 wherein:
   said inner electrode has a second width measured from said outer end of said fourth side of said inner electrode to said inner end of said fourth side of said inner electrode;
   said inner electrode has a second height measured from said inner end of said fifth side of said inner electrode to said outer end of said fifth side of said inner electrode;
   said second width being less than said first width;
   said second height being less than said first height.

9. The apparatus of claim 1 wherein said first terminal of said at least one switch is connected to a free end of a fin extending from said second side of said outer terminal towards said outer end of said fifth side of said inner electrode.

10. The apparatus of claim 9 wherein said second terminal of said at least one switch is connected to said outer end of said fifth side of said inner electrode.

11. The apparatus of claim 1 wherein:
    said first aperture has a first aperture height measured from said first end of said first side of said outer electrode to said outer end of said fourth side of said inner electrode;
    said second aperture has a second aperture height measured from said outer end of said fourth side of said inner electrode to said first end of said second side of said outer electrode;
    said first aperture height being approximately equal to said second aperture height.

12. The apparatus of claim 4 wherein:
    said outer electrode has a first longitudinal length;
    said inner electrode has a second longitudinal length;
    said first longitudinal length being approximately equal to said second longitudinal length.

13. The apparatus of claim 12 wherein said first dielectric has a third longitudinal length and wherein said first dielectric comprises a plurality of permittivities along said third longitudinal length.

14. The apparatus of claim 13 wherein said second dielectric has a third longitudinal length and wherein said second dielectric comprises a plurality of permittivities along said third longitudinal length.

15. The apparatus of claim 14 comprising a plurality of switches each having a first terminal electrically connected to said outer electrode and a second terminal electrically connected to said inner electrode, at least one of said switches connected to said inner electrode adjacent a first portion of said first dielectric comprising said first permittivity and a second of said switches connected to said inner electrode adjacent a second portion of said first dielectric comprising a permittivity different from said first permittivity.

16. The apparatus of claim 15 wherein said first and second switches are configured to be activated separately from one another.

17. The apparatus of claim 1 further comprising a plurality of said integrated antenna electromagnetic energy radiating modules.

18. The apparatus of claim 17 wherein said plurality of integrated antenna electromagnetic energy radiating modules are arranged adjacent to each other in an array.

19. The apparatus of claim 18 wherein at least one of said switches from each of at least two of said integrated antenna electromagnetic energy radiating modules are configured to be activated approximately simultaneously.

20. The apparatus of claim 14 wherein said first permittivity has a different value than said second permittivity.

21. The apparatus of claim 4 wherein said inner and outer electrodes, said first and second apertures, said at least one switch, and said first and second dielectrics are configured such that said apparatus exhibits a first resonant frequency at which said microwaves are emitted.

22. The apparatus of claim 21 wherein said inner and outer electrodes, said first and second apertures, said at least one switch, and said first and second dielectrics are configured such that said apparatus exhibits a second resonant frequency at which said microwaves are emitted different from said first resonant frequency.

* * * * *